United States Patent [19]

Lehmann et al.

[11] Patent Number: 4,525,678

[45] Date of Patent: Jun. 25, 1985

[54] MONOLITHIC LOW NOISE COMMON-GATE AMPLIFIER

[75] Inventors: Randall E. Lehmann, Garland; Gailon E. Brehm; David J. Seymour, both of Plano, all of Tex.

[73] Assignee: Texas Instruments Incorporated, Dallas, Tex.

[21] Appl. No.: 395,399

[22] Filed: Jul. 6, 1982

[51] Int. Cl.³ .............................................. H03F 3/60
[52] U.S. Cl. .................................... 330/277; 330/286; 330/296; 330/311; 330/307
[58] Field of Search ............... 330/277, 286, 311, 296, 330/307

[56] References Cited

U.S. PATENT DOCUMENTS 4,390,851  6/1983  Higgins et al. ................. 330/286 X

OTHER PUBLICATIONS

Petersen et al., "A Monolithic GaAs 0.1 to 10 GHz Amplifier", Conference: 1981 IEEE.
MIT Symposium Proceedings, International Microwave Symposium Digest, Jun. 16–19, 1981, R. S. Pengelly et al., "A Comparison Between Actively and Passively Matched S–Band GaAs Monolithic FET Amplifiers", pp. 367–369, p. 368; FIG. 5, Los Angeles, CA.

Primary Examiner—James B. Mullins
Attorney, Agent, or Firm—Robert Groover; James T. Comfort; Melvin Sharp

[57] ABSTRACT

A monolithic amplifier having a common-gate input stage with a device transconductance which is higher than required for input match, and a load impedance presented to the common-gate stage which is not conjugate matched. The present invention teaches a common-gate configuration using an FET with higher transconductance and a higher output load impedance. Over narrower bandwidths, excellent input match is thus obtained with noise figures at least as good as those obtained with the common-source approach. This combination of noise figure and input match is achieved in a compact monolithic structure.

12 Claims, 8 Drawing Figures

MONOLITHIC LOW NOISE COMMON-GATE AMPLIFIER

BACKGROUND OF THE INVENTION

Two basic approaches are currently being employed in the design of monolithic low noise amplifiers. The conventional approach uses an input FET in a common-source configuration with the necessary input matching circuitry to achieve minimum noise figure. See Lehmann, Brehm, and Westphal, "10 GHz 3-Stage Monolithic 4 dB Noise Figure Amplifier," 1982 *IEEE International Solid-State Circuits Conference Digest of Papers,* Feb. 11, 1982, pp. 140–141 which is hereby incorporated by reference. This design can achieve very low noise figure, but also has a high input voltage standing wave ratio (VSWR) (typically 3:1 or 4:1) because the input matching circuit presents the required noise match impedance for minimum noise figure rather than a conjugate match. Because of the high input VSWR, this design must incorporate a 3 dB hybrid (coupler) at the input and output to integrate into any receiver. This balanced configuration requires a matched pair of amplifiers as well as 3 dB hybrids at the input and output. This approach, when implemented monolithically, consumes a great deal of GaAs real estate.

The second approach employs an input FET in a common-gate configuration, often referred to as "active-matching". This design achieves good input VSWR but at the expense of degrading the noise figure. Such an approach has been demonstrated by Petersen et al, see "Monolithic GaAs Microwave Analog Integrated Circuits", *Interim Report for ERADCOM,* September 1980, which is hereby incorporated by reference; and Estreich, "A Wideband Monolithic GaAs IC Amplifier," 1982, *IEEE International Solid State Circuits Conference Digest of Papers,* Feb. 11, 1982, pp. 194–195 which is hereby incorporated by reference. See also Pengelly et al, "A Comparison between Actively and Passively Matched S-band GaAs Monolithic FET Amplifiers", *MTT Symposium Digest of Papers* 1981, pp. 367–369, which is hereby incorporated by reference. In this prior art, the common-gate FET is operated at a bias condition to achieve a device transconductance, $g_m$, of approximately 20 mS. Because the input impedance of a common-gate FET is approximately $1/g_m$, the input impedance is nominally 50 ohms. At this bias condition, input VSWR is optimized over a broadband of frequency, but one sacrifices often the most critical performance parameter, noise figure. Computer modeling at TI has shown that noise figure can be considerably improved if the FET can be operated at higher values of transconductance.

In the prior art, balanced amplifier techniques are commonly used to achieve good input and output match. However, such balanced techniques require that the entire amplifier be duplicated, and thus gross economies of semiconductor real estate are required. It would be highly desirable to have a single-ended amplifier design, i.e. an amplifier design which did not require duplication of active stages, which also provided good noise figure and input matching.

Thus, it is an object of the present invention to provide a single-ended low-noise amplifier with good input matching.

A great many high-frequency system applications require a low-noise input stage which has good input impedance matching at microwave frequencies.

A principal area of developing technology, where a crucial need for low-noise amplifiers exist, is in the area of microwave receivers. The crucial first step in any microwave receiver system is to amplify the rf signal, as received at the antenna, to raise it above the background of thermal and other noise. It is particularly desirable to be able to provide such a low-noise input stage in an integrated embodiment. Such low-noise input stages are required in, for example, conventional radar, phased-array radar, uplink and downlink stages of satillite communications receivers, home TV RO (television receive only) systems, police radar, intrusion alarm systems, microwave point-to-point relay systems, and mobile radio systems.

A further area of applications, where critical need for such low-noise integrated input stages exists, is in sensors. In many sensor applications, the compactness and economy permitted by an integrated design is even more critical than in receivers. In particular, low-noise microwave amplifiers are needed for pollution monitoring equipment. In such systems, microwave resonant absorptions characteristic of various pollution components can be used to determine the type and density of a particular pollutant with extreme precision, by remote microwave sensing. Similarly, in petrochemical processing, microwave sensing can be used for very accurate detection of the percentage of methane or other process components in a process gas stream. Low-noise microwave amplifiers are also needed for sensing of environmental microwave radiation, to detect and measure possible human health hazards. Finally, an additional biomedical application is radiometry, in which the amount of microwave radiation applied to or transmitted through living tissue must be precisely measured.

Thus it is an object of the present invention to provide a low-noise microwave amplifier having good input impedance match.

It is a further object of the present invention to provide an integrated low-noise microwave amplifier having very good impedance match.

It is a further object of the present invention to provide a microwave receiver systems having very low system noise temperatures.

It is a further object of the present invention to provide microwave receiver systems having very low system noise temperatures in room temperature operation.

SUMMARY OF THE INVENTION

The present invention is a low noise amplifier having a common-gate first stage, which achieves a combination of input match and low-noise performance not previously available. The device transconductance of the FET used in the common-gate input stage is raised to a transconductance higher than the reciprocal of the input impedance. This higher device transconductance places the device in its low-noise regime. Input match is then achieved by using a high load impedance for the common-gate stage. The load impedance is *not* a conjugate match to the output impedance. Because of the drain-source capacitance of the common-gate FET, the higher load impedance presented to the output of the common-gate device also means that the common-gate device presents a higher input impedance at the input of the device. The high load impedance used has the further advantage that the voltage gain of the common-gate device is maximized, which produces a high signal-to-noise (S/N) ratio. The common-gate input stage is then preferably followed by one or more common-source stages, to achieve the necessary total gain and/or power. Very low noise and very good input match is achieved at the input stage of the amplifier, where it is most critical.

According to the present invention there is provided: a microwave amplifier for amplifying an input signal provided over a line having a predetermined source impedance, comprising: means for receiving said input signal from said line; a first field-effect transistor comprising a gate, a source, and a drain, said transistor having said source thereof connected to said input means, said gate being grounded; bias means connected to provide a bias current through said FET, said bias current being selected so that said transistor has a very low noise figure, said gate of said transistor having a width such that said transistor has a transconductance which is greater than the reciprocal of said source impedance at said selected bias current; load impedance means, connected to the drain of said transistor to provide a load impedance which is greater than said source impedance; and an additional amplifier stage, said additional amplifier stage comprising an interstage input which is connected to said drain of said field effect transistor.

BRIEF DESCRIPTION OF THE DRAWINGS

The present invention will be described with reference to the accompanying figures, wherein.

DESCRIPTION OF THE PREFERRED EMBODIMENTS

Figure 1:
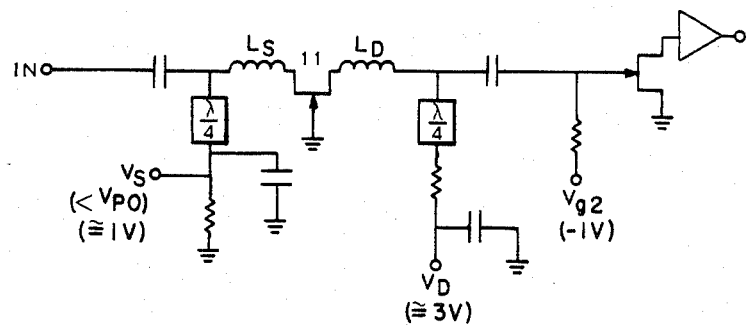
FIG. 1 is a circuit diagram of a sample embodiment of the amplifier of the present invention.

The monolithic low noise amplifier of the present invention employs a common-gate FET for active matching at the input, operated at an optimum transconductance to achieve low noise figure. One or more common-source stages are driven by the common-gate stage to provide an adequate total gain. The amplifier is preferably integrated monolithically on a GaAs substrate, to achieve tighter control of circuit and device parasitics than can be achieved with a hybrid (discrete FET) implementation. This design makes use of the drain-to-source feedback properties (specifically, the drain-source capacitance) of a common-gate FET. Proper impedance loading at the drain of the FET yields an input impedance of 50 ohms, or other input impedances as required for specific system applications. The high load impedance presented to the output of the FET also provides high voltage gain, which is important in maximizing the signal-to-noise ratio (S/N) through the first stage of the low noise amplifier.

This is the first demonstration of common-gate active matching with a high device transconductance to achieve both low input VSWR and low noise figure. For bandwidths on the order of 10-30%, this design technique allows single-ended performance without degrading the noise figure. For most radar and satellite receiver applications only 10-20% bandwidths are required, thus giving an excellent opportunity to use single-ended low noise amplifiers with good input VSWRs and low noise figures. The FET used for active matching occupies less GaAs real estate than a passive matching circuit (distributed transmission lines and capacitors) as might be used in a conventional common-source input low noise amplifier. A common-gate low noise amplifier will consume approximately four times less GaAs than the balanced common-source low noise amplifier. This fact alone greatly reduces cost and complexity and improves yield and reliability.

The performance tradeoff one must tolerate is bandwidth versus noise figure. Large bandwidths (greater than an octave) are achieved with prior art techniques by employing the necessary first stage load impedance. This load impedance is proportional to the Q required for the circuit. Thus, broadband operation requires low Q circuits, resulting in lower voltage gains and higher noise figures. The noise figure-bandwidth tradeoff must be addressed for each specific application.

Though active matching with common-gate FETs is applicable to many microwave components (e.g., power amplifiers, switches, attenuators, etc.), the present invention is specific to low noise amplifiers where the achievement of high voltage gain, low noise figure and good input VSWR are possible.

Thus, the key idea of the present invention is that the channel conditions are optimized for low-noise performance, independently of input matching requirements. The conventional wisdom teaches that minimum-noise operation is achieved at a channel current of about 15% of the saturated current ($I_{DSS}$). However, better low-noise optimization has been found to be achieved at a channel bias current of 30 to 50 microamperes per micron of gate width. Thus, for example, where a 300 micron FET is used for the common-gate stage (as is presently preferred), a bias current in the neighborhood of 10 to 15 milliamps is preferred.

After the channel current density has been selected to achieve minimum noise, the gate width is selected to achieve the desired high transductance at the low-noise gate current density. The longer the device gate width is, the higher the transconductance is. Thus, gate widths as large as possible are desirable, subject to the constraints of power consumption and real estate. That is, very wide gates will consume significant amounts of power, which is often undesirable in microwave receiver applications.

A further advantage of using wide gates is that a wider-gate device inherently generates less noise, under analogous operating conditions, than does a narrower-gate device. The equivalent input noise voltage is inversely proportional to the square root of the gate width of the device. Devices having very large gate widths have not been preferred in such applications in the prior art, since the device imput impedance normally becomes quite low and the device therefore becomes difficult to match.

Figure 8:
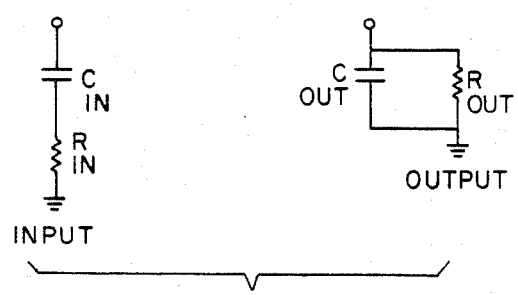
FIG. 8 shows equivalent circuits for the input and output impedances of the FET device.
Figure 7:
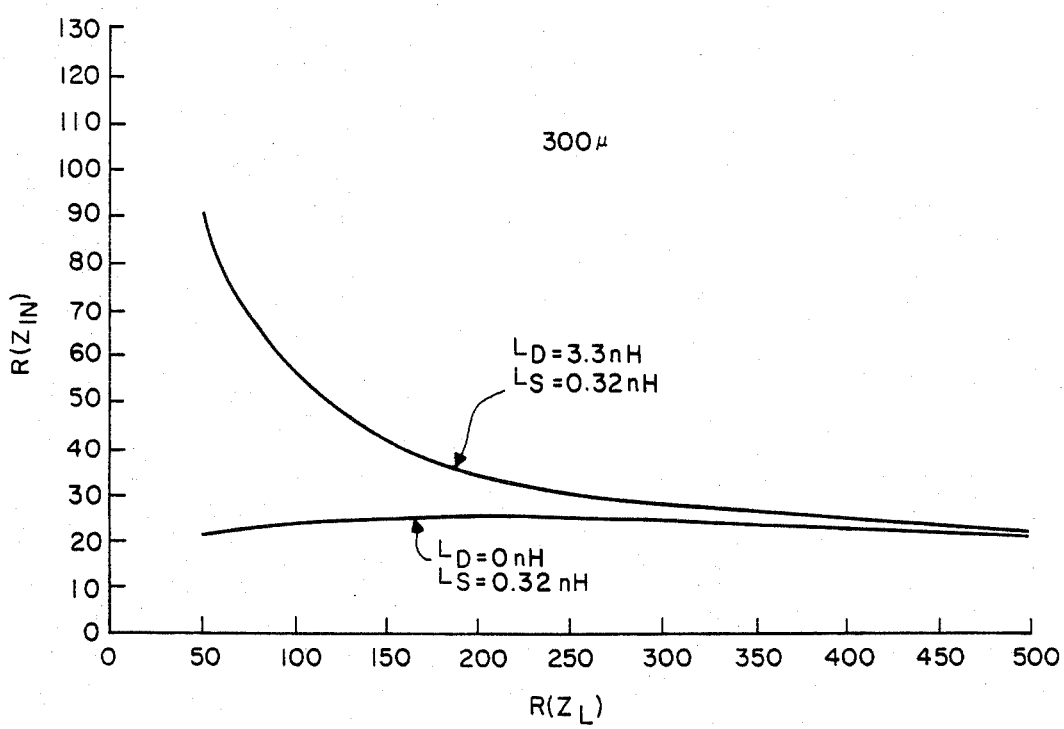

Typically FET is as such as those preferred will show a significant reactive component in their output impedance at the frequencies of interest. For example, at 10 GHz, a reactive component equivalent to the shunt capacitance shown in FIG. 8 will typically appear. Preferably this reactive component is conjugately matched, e.g. by a series inductance in the interstage load circuit. This inductance is used to achieve broader frequency bandwidth, but it should be noted that a full conjugate match is *not* used, since the real component of the device output impedance is not matched. The selection of load impedance is more clearly seen in FIGS. 4-7. For example, in FIG. 7, which relates to a 300 micron gate width device at 10 GHz, the upper curve shows a circuit where a 3.3 nanohenry inductance has been used to compensate the reactive output impedance of the device. In this case, to achieve a 50 ohm real input impedance, the real part of the load impedance is selected to be approximately 110 ohms. Similarly, with a 225 micron gate width device, the real part of the load impedance can be made as high as 240 ohms while still preserving perfect input match, if a reactive component $L_D$ of 5 nanohenries is used to compensate the reactive component of the output impedance. Similarly, with a 200 micron gate width device, a load impedance having a real component of 290 ohms can be used at this same frequency, where a 5 nanohenry $L_D$ reactive component is used.

It is also sometimes useful to use a source-trimming reactance $L_S$, to adjust the imaginary component of the input impedance to zero. This component will typically also be a series inductance, and its value will be typically less than a nanohenry. The use of this input reactive-trimming component depends on device characteristics and frequency range, and frequently is not necessary at all.

A further area where trimming may be useful is adjusting the bias current. That is, since the components used to define the load impedance may be slightly inaccurate, adjustment of the bias current within the low noise regime can be used to find-tune the input match. Of course, use of decreased bias current can lower the device transconductance and thereby assure input match, but this method sacrifices the low-noise advantages to which the present invention is primarily directed. That is, when a 300 micron device is biased in the low-noise regime, it will typically exhibit a transconductance in the neighborhood of 60 mS, but use of smaller bias currents could alter the same device's transconductance to 20 ms, which would result in a broadband high-noise circuit very like that taught by the prior art.

In the paired curves of FIGS. 4-7, the lower curve on each figure indicates a purely resistive load impedance. Thus, these two curves (or the three curves of FIG. 5) merely provide examples of the variety of curves in between. It is also alternatively possible to use a greater reactive impedance in the load impedance circuit than required for conjugate match to the reactive portion of the output impedance of the device, but this is not presently preferred. However, this embodiment is within the scope of the present invention. Using this alternative, it is possible to use a load impedance having a real part which is even slightly higher than that otherwise possible.

Figure 2:
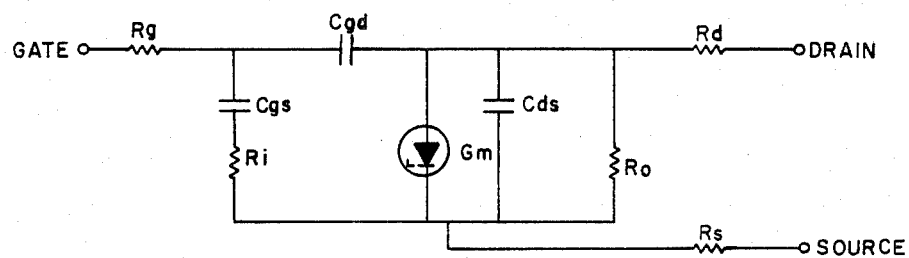
FIG. 2 shows an equivalent circuit for an FET.

To select the load impedance for input matching, several methods can be used. Alternatively, empirical matching, based on the characteristics of the actual device used, can of course be applied. For example, careful dc and rf characterization of the GaAs FET provides the foundation for the predicted amplifier performance and the circuit components that will be required. An FET is mounted on a metal carrier (typically KOVAR, molybdenum, or copper) with solder and attached to 50 ohm microstrip transmission lines with bond wires. This test fixture provides an easy method for evaluating the rf properties of the transistor in a 50 ohm system. If the measurement system employs a different characteristic impedance (e.g., 75 ohm for the telephone industry), the appropriate microstrip characteristic impedance would be preferred. Measurement of dc parameters of the device can be made on the chip prior to or after mounting on the metal carrier. To determine the intrinsic device properties at microwave frequencies, scattering-parameters (S-parameters) are measured across a broadband of frequencies. The S-parameters treat the device as a 2-port entity, describing the input impedance ($S_{11}$), the output impedance ($S_{22}$), the forward transmission coefficient ($S_{21}$), and the reverse transmission coefficient ($S_{12}$). S-parameters are measured with the FET operating at the bias conditions that will be assumed in the final design. For the first stage of a multi-stage low noise amplifier, this bias condition is determined by finding the voltages and currents required to optimize the device noise figure and gain at the desired frequency or frequencies. Knowing the dc and rf properties of the FET, an equivalent circuit model is then derived with the aid of a computer. A simple hybrid equivalent circuit, shown in FIG. 2, is used to simulate the device. Either a search routine or an optimization routine is then used to determine possible load impedances with which, when connected to the output (drain) of the FET, an input impedance of 50 ohms can be achieved. For designs in which a specific bandwidth is required, the input impedance is examined across the entire frequency range, and $Z_L$ adjusted accordingly to maintain nearly constant 50 ohm input impedance. Of particular interest to this design procedure is an accurate determination of the series equivalent input impedance and the parallel equivalent output impedance. Using these equivalent circuits, initial values for circuit components are picked to optimize the load impedance ($Z_L$) of the first stage so that the magnitude of $Z_L$ can be maximized while also maintaining the constraints on $Z_L$ which provide a device input impedance of approximately 50 ohms. One desires to maximize $Z_L$ across the required frequency band so as to maximize the voltage gain of the first stage. Because an FET operated in a common-gate configuration has unity current gain, the voltage gain, $A_V$, is simply the ratio of the load impedance, $Z_L$, to the input impedance, $Z_{IN}$: $A_V = Z_L/Z_{IN}$. The load impedance seen by the first stage is a complex impedance consisting of the interstage circuitry and the input impedance of the second stage FET. The interstage circuitry can be designed with an infinite number of combinations of lumped-element (inductors, capacitors, and resistors) and/or distributed (transmission lines, microstrip, open- and short-circuited stubs) components. In the presently preferred design, a quasi-lumped-element approach was taken. The initial design was done with lumped-element components, using shunt inductors for impedance matching and biasing. Inductors are modeled as high-impedance transmission lines in the final monolithic design optimization.

As part of the analysis of the final design, the amplifier performance can be examined with the aid of one or more computer programs. SPICE2 computes the noise voltages associated with the resistive components in the devices and the rf circuitry. This routine permits an analysis of where the major contributions to noise are occurring and the voltage gains of each stage of the low noise amplifier. If the load impedance to the first stage is not correct, the voltage gain calculation will bear this out. If the voltage gain is lower than anticipated, the noise figure will also be degraded. To achieve minimum noise figure, the voltage gain must be maximized to improve the S/N ratio, while still maintaining the desired input impedance. COMPACT, another computer-aided design program, is also used to optimize gain, input and output VSWR, and examine the stability of the low noise amplifier.

The physical layout of the monolithic circuit is important to achieving the desired performance of the low noise amplifier. One of the critical aspects of the common-gate low noise amplifier design is the repeatable performance of the common-gate FET. This is preferably achieved by having a fully monolithic chip capable of providing low and exactly repeatable gate lead inductance. This helps to ensure stability of the amplifier. This low noise amplifier also employs pi-gate type FETs and air bridge crossover structures to connect portions of the FET to ground and to connect capacitor top plates to rf transmission lines.

Thus, the present invention provides the key feature of a very low-noise input stage, which has a very good input impedance match. The common-gate input stage is necessarily followed by at least one additional amplifying stage. The following stages may be either common source or source-follower stages. In the presently preferred embodiment, the common-gate input stage is followed by at least one common-source stage, as shown in FIG. 1. Note that the higher load impedance used, according to the present invention, for the load presented to the first (common-gate) stage means that a substantial mismatch is caused at the input to the second stage. However, this mismatch does not matter, since the present invention is directed to achieving good voltage transfer into the second stage, but power transfer at this point is not important. That is no attempt is made to match the real part of the output impedance of the grounded-gate FET. Of course, more than one following stage, after the input stage, can alternatively be used. Source follower final stages can also be used, to achieve a broader-band output match.

As shown in FIG. 1, the presently preferred embodiment uses a separate bias supply in the common-gate amplifier stages. That is, the connection $V_S$ is used to specify the bias point of the FET 11, and the connection $V_D$ is used for the higher-voltage supply. Thus, for example, a 300 micron device is used in the presently preferred embodiment, having a pinch off voltage of about one and one half volts. In this case, about one volt would be supplied to terminal $V_S$ for biasing, and about three volts would be supplied to terminal $V_D$ to achieve voltage again.

In the preferred integrated embodiment, the inductors shown are configured as quasi-lumped elements, that is as short sections of mismatched transmission line, i.e. having an impedance higher than the surrounding transmission lines portions. Capacitors are preferably configured as MIM capacitors, using a silicon nitride dielectric. The substrate is preferably semi-insulating (chromium-doped gallium arsenide). The particular device structure preferably used for the grounded-gate FET 11 is discussed in greater detail below.

Many features can be added to the common-gate low noise amplifier to improve its performance and its implementation in systems. The low noise amplifier can be biased with a single supply. This has a decided advantage in many systems. The active devices can be "self-biased" with the use of monolithic resistors. Dual-gate FETs will be employed to provide gain and/or phase control or trimming. Monolithic diodes will be used for rf power limiting, voltage regulation and reactive impedance loading (varactor diodes). Various A/D or D/A circuitry can be added to provide compatibility with TTL or other control systems. Monolithic switches can be incorporated to permit redundant low noise amplifiers or receivers on the same chip, or to allow switching of two or more low noise amplifiers to receive several frequency bands.

Figure 3:
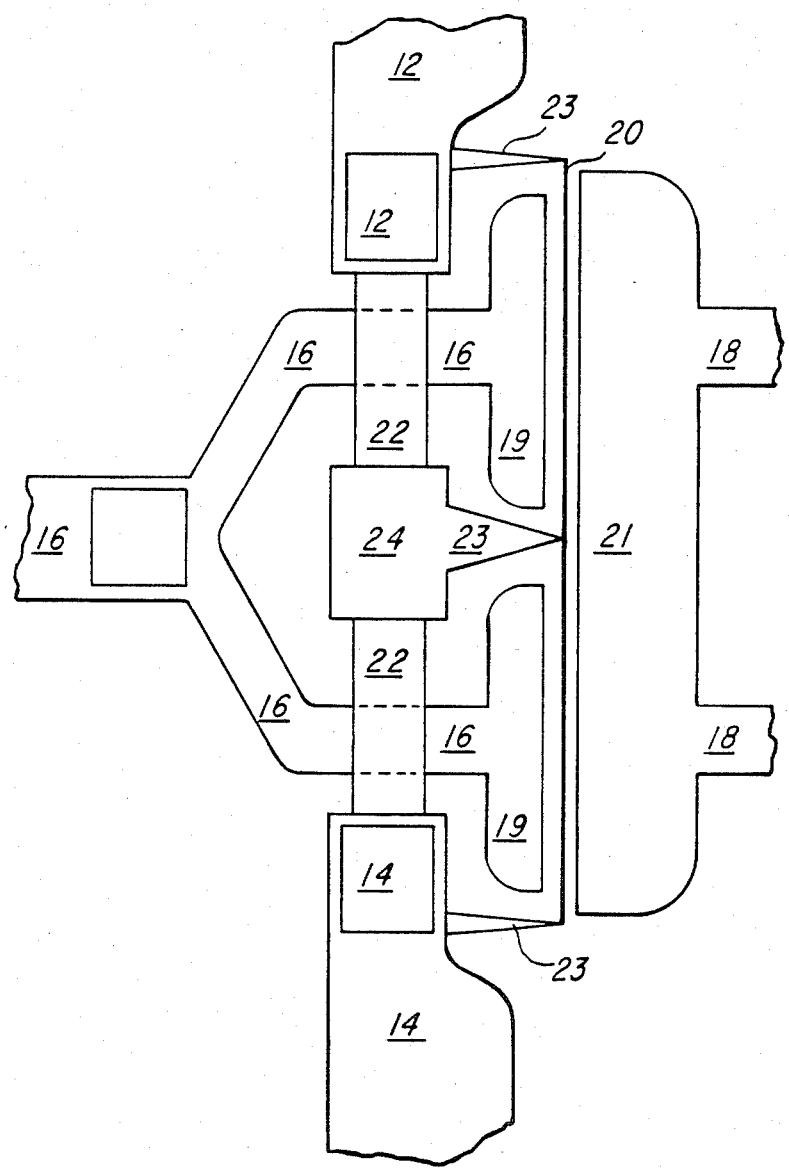
FIG. 3 shows the preferred device configuration used in the inventive amplifier.
Figure 4:
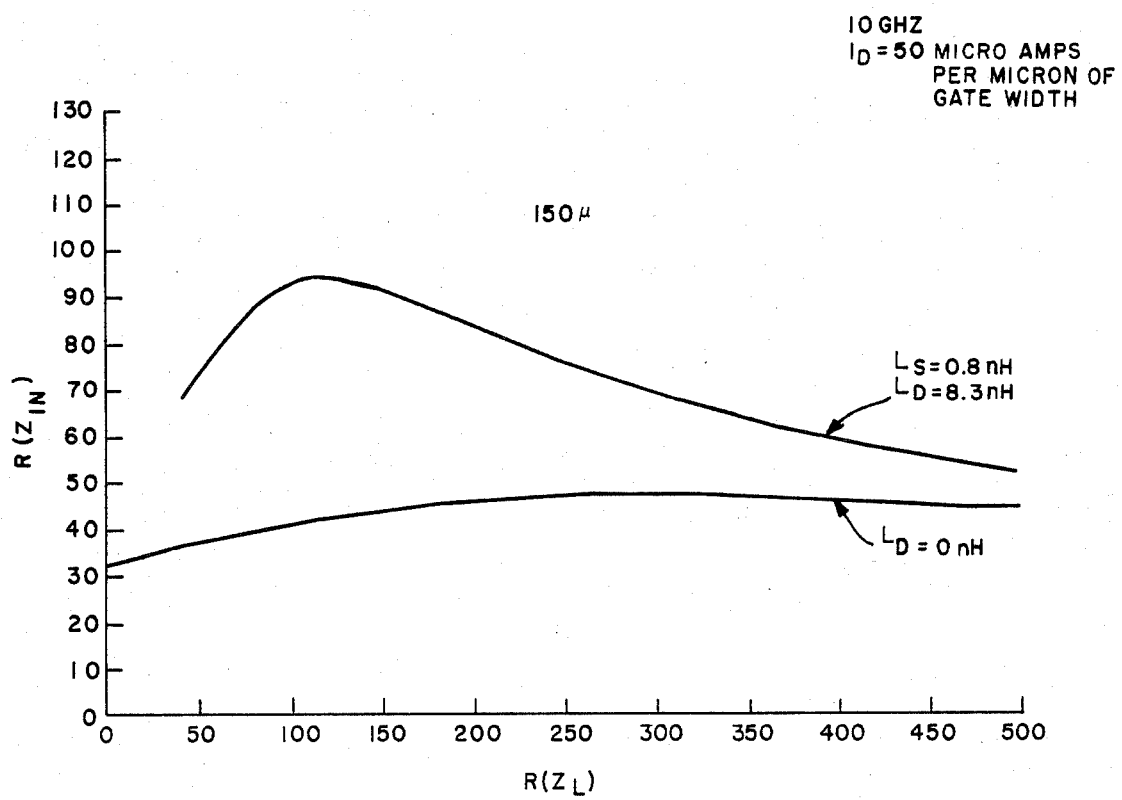
FIGS. 4-7 show the relation between the real part of the load impedance and the real part of the input impedance for various gate widths, at 10 GHz.
Figure 5:
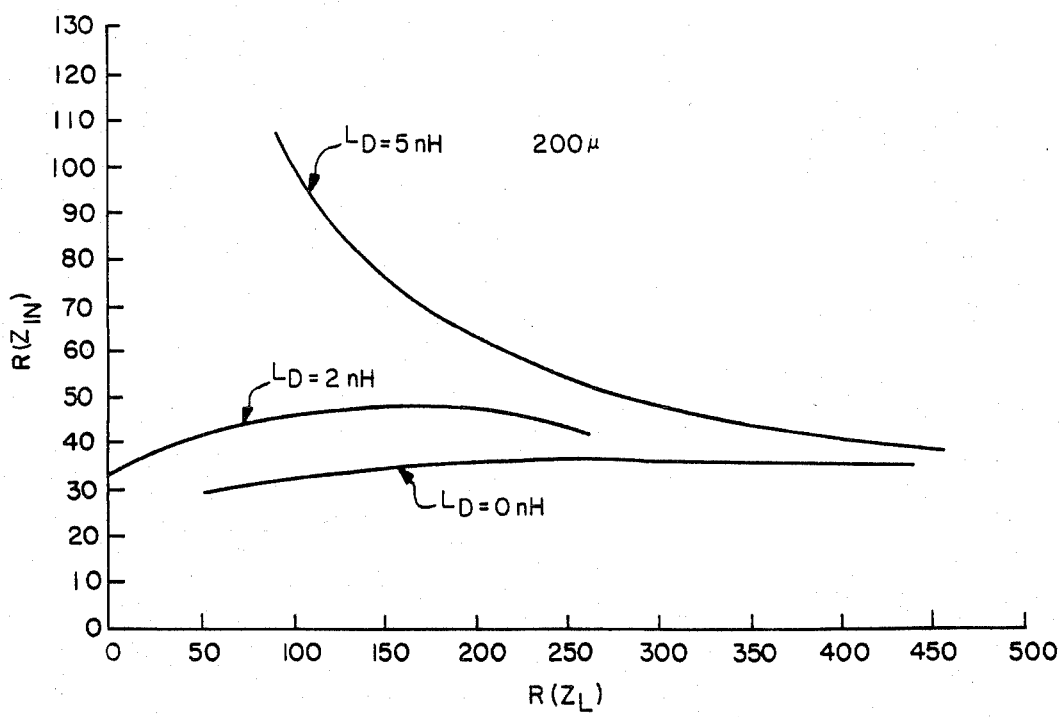
Figure 6:
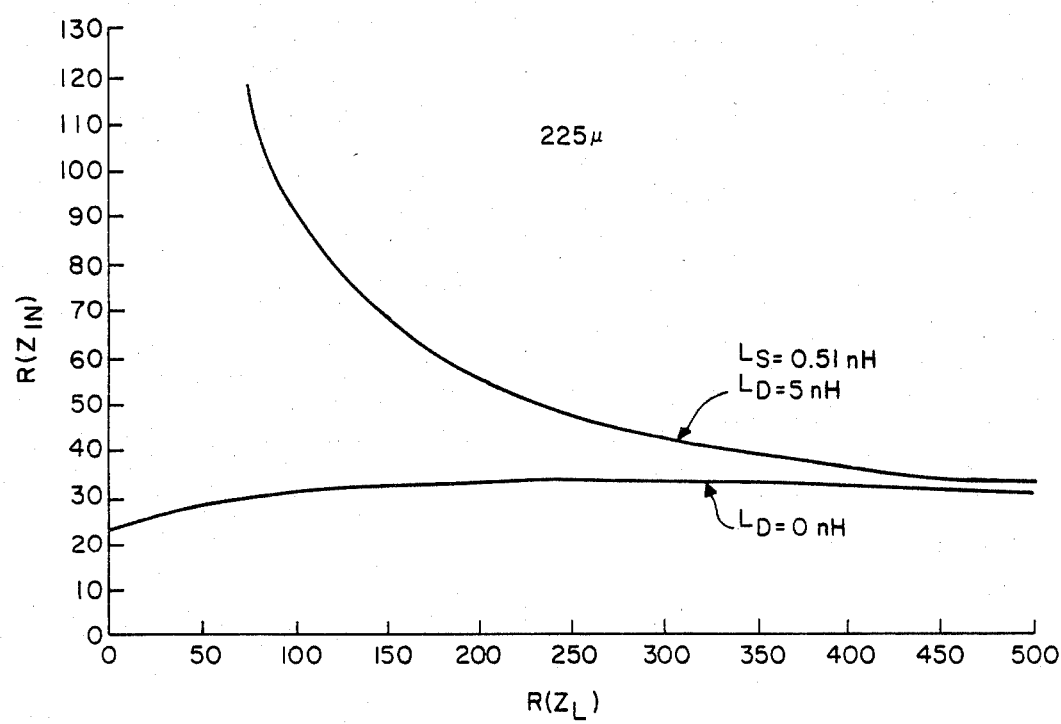

Preferably, in order to provide low and exactly repeatable common lead inductance (gate lead inductance) and low feedback parasitics in a common-gate GaAs FET amplifier, the gate electrode is connected to ground at various points along its width by means of an air bridge crossover structure. This structure crosses over the input (source) lines with very low capacitance. Since the gate lead inductance is low in this design, and because in monolithic form this inductance does not vary as is the case for a device grounded using bond wires, common-gate circuit stability is assured. This device preferably uses the well-known pi-gate configuration to provide low drain-gate parasitic capacitance and equal phasing to all parts of the device. This device structure is shown in FIG. 3.

These three features—air bridge interconnection of the gate feed points to ground, multiple feedpoints to the source input and drain output, and the "pi-gate" device design—provide the low and repeatable gate inductance, low gate-drain feedback, and equal phasing essential for a stable, high-performance common-gate amplifier.

The preferred embodiment combines the advantages of the basic "pi-gate" GaAs FET device design with the circuit performance advantages achieved by the common-gate configuration. FIG. 1 shows that in the common-gate configuration, the FET gate is connected to ground in a low-inductance fashion, the input signal is applied to the source, and the output is taken from the drain. This configuration offers very good input match along with good noise figure. Problems with poor stability and poor control of parasitics have previously limited the implementation of this important circuit configuration.

The monolithically integrated common-gate microwave pi-gate GaAs FET provides the performance advantages of common-gate circuits without any stability problem. This novel device design, shown in FIG. 3, provides an air-bridge interconnection of the gate feed points to ground. As a result, the gate-to-ground inductance is minimal and is exactly repeatable from device to device. The pi-gate configuration with the single gate stripe located in a vertical line between the source and drain provides minimum feedback capacitance. Multiple gate and drain feeds are used to provide equal phasing over the whole device.

Thus, the present invention provides a crucial new innovation in low-noise microwave amplifiers. In particular, the present invention makes possible a new degree of performance in microwave receivers. In addition, the present invention is integrated low-noise amplifier, providing further economical advantages. Moreover, the present invention provides very low noise performance in a room-temperature receiver.

Thus, due to these advantages, the present invention is crucially important in the art of microwave receivers. However, it is also of substantial importance in a wide variety of other microwave amplification applications.

The scope of the present invention is therefore not limited except as set forth in the following claims.

What is claimed is:

1. A microwave amplifier for amplifying an input signal provided over a line having a predetermined source impedance, comprising:
   means for receiving said input signal from said line;
   a first field-effect transistor comprising a gate, a source, and a drain, said transistor having said source thereof connected to said input means, said gate being grounded;
   bias means connected to provide a bias current through said FET, said bias current being selected so that said transistor has a very low noise figure, said gate of said transistor having a width such that said transistor has a transconductance which is greater than the reciprocal of said source impedance at said selected bias current;
   load impedance means, connected to the drain of said transistor to provide a load impedance which is greater than said source impedance; and
   an additional amplifier stage, said additional amplifier stage comprising an interstage input which is connected to said drain of said field effect transistor.

2. A microwave amplifier for amplifying an input signal provided over a line having a predetermined source impedance, comprising:
   means for receiving said input signal from said line;
   a first field-effect transistor comprising a gate, a source, and a drain, said transistor having said source thereof connected to said input means, said gate being grounded;
   bias means connected to provide a bias current through said FET, said bias current being selected so that said transistor has a very low noise figure, said gate of said transistor having a width such that said transistor has a transconductance which is greater than the reciprocal of said source impedance at said selected bias current;
   load impedance means, connected to the drain of said transistor to provide a load impedance which has a real part greater than the real part of the output impedance of said transistor; and
   an additional amplifier stage, said additional amplifier stage comprising an interstage input which is connected to said drain of said field effect transistor.

3. The amplifier of claim 1 or 2, wherein said FET comprises a MESFET.

4. The amplifier of claim 3, wherein said MESFET comprises a gallium arsenide channel region.

5. The amplifier of claim 1 or 2, wherein said additional amplifier stage is a common-source amplifier stage comprising:
   a second field effect transistor, said second field effect transistor comprising a gate, a source, and a drain;
   said gate of said second transistor being operatively connected to said drain of said first transistor, and a first one of said drain and source of said second transistor being operatively connected to said gate of said first transistor;
   said second transistor providing an output from the second one of said drain and source of said second amplifier.

6. The amplifier of claim 5, wherein said additional amplifier stage is further connected to provide input to an additional amplifier stage.

7. The amplifier of claim 1 or 2, wherein said load impedance is sufficiently high that said source of said field effect transistor provides a match to said input impedance in the neighborhood of a predetermined microwave frequency.

8. The amplifier of claim 1 or 2, wherein said additional stage comprises a source-follower stage, said source-follower stage comprising:
   an additional field effect transistor having a source, a gate, and a drain, said gate of said additional field-effect transistor being operatively connected to said drain of said first transistor.

9. The amplifier of claim 1 or 2, wherein said transistor comprises a gate width 300 microns or more.

10. The amplifier of claim 1 or 2, wherein said bias supply means provides a bias current through the channel of said FET which is in the range of 30 to 60 micro amperes per micron of width of said gate of said transistor.

11. A microwave amplifier for amplifying an input signal provided over a line having a predetermined first terminal impedance, comprising:
    means for receiving said input signal from said line;
    a first field-effect transistor comprising a gate, a first terminal, and a second terminal, said transistor having said first terminal thereof connected to said input means, said gate being grounded;
    bias means connected to provide a bias current through said FET, said bias current being selected so that said transistor has a very low noise figure, said gate of said transistor having a width such that said transistor has a transconductance which is greater than the reciprocal of said first terminal impedance at said selected bias current;
    load impedance means, connected to the second terminal of said transistor to provide a load impedance which is greater than said first terminal impedance; and
    an additional amplifier stage, said additional amplifier stage comprising an interstage input which is connected to said second terminal of said field effect transistor.

12. A microwave amplifier for amplifying an input signal provided over a line having a predetermined first terminal impedance, comprising:
    means for receiving said input signal from said line;
    a first field-effect transistor comprising a gate, a first terminal, and a second terminal, said transistor having said first terminal thereof connected to said input means, said gate being grounded;
    bias means connected to provide a bias current through said FET, said bias current being selected so that said transistor has a very low noise figure, said gate of said transistor having a width such that said transistor has a transconductance which is greater than the reciprocal of said first terminal impedance at said selected bias current;
    load impedance means, connected to the second terminal of said transistor to provide a load impedance which has a real part greater than the real part of the output impedance of said transistor; and
    an additional amplifier stage, said additional amplifier stage comprising an interstage input which is connected to said second terminal of said field effect transistor.

* * * * *